(12) United States Patent
Nakata et al.

(10) Patent No.: US 6,717,178 B2
(45) Date of Patent: Apr. 6, 2004

(54) SEMICONDUCTOR DEVICES FABRICATED USING SPUTTERED SILICON TARGETS

(75) Inventors: Yukihiko Nakata, Vancouver, WA (US); Apostolos Voutsas, Portland, OR (US); John Hartzell, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/218,744

(22) Filed: Aug. 13, 2002

(65) Prior Publication Data

US 2002/0192933 A1 Dec. 19, 2002

Related U.S. Application Data

(62) Division of application No. 09/576,939, filed on May 22, 2000, now Pat. No. 6,432,804.

(51) Int. Cl.[7] .............................................. H01L 29/04
(52) U.S. Cl. ........................... 257/52; 257/51; 438/482; 204/192.17
(58) Field of Search .............................. 257/50, 52, 58, 257/66, 67, 347, 618, 77, 78, 394, 462; 438/592, 482

(56) References Cited

U.S. PATENT DOCUMENTS 4,443,930 A * 4/1984 Hwang et al. ............... 438/299
6,040,939 A * 3/2000 Demiryont et al. ......... 359/360

* cited by examiner

*Primary Examiner*—Dung A. Le
(74) *Attorney, Agent, or Firm*—David C. Ripma; Matthew D. Rabdau

(57) ABSTRACT

A thin film transistor includes an active silicon layer deposited by physical vapor deposition (PVD), wherein a silicon precursor is doped with impurities prior to use as a target in the PVD chamber, wherein the precursor has a resistivity in the range of about 0.5 $\Omega$-cm$<\rho_s<$60 $\Omega$-cm; and wherein the target includes plural, rectangular tiles wherein all individual tiles are larger than 8.5 inches square.

10 Claims, 4 Drawing Sheets

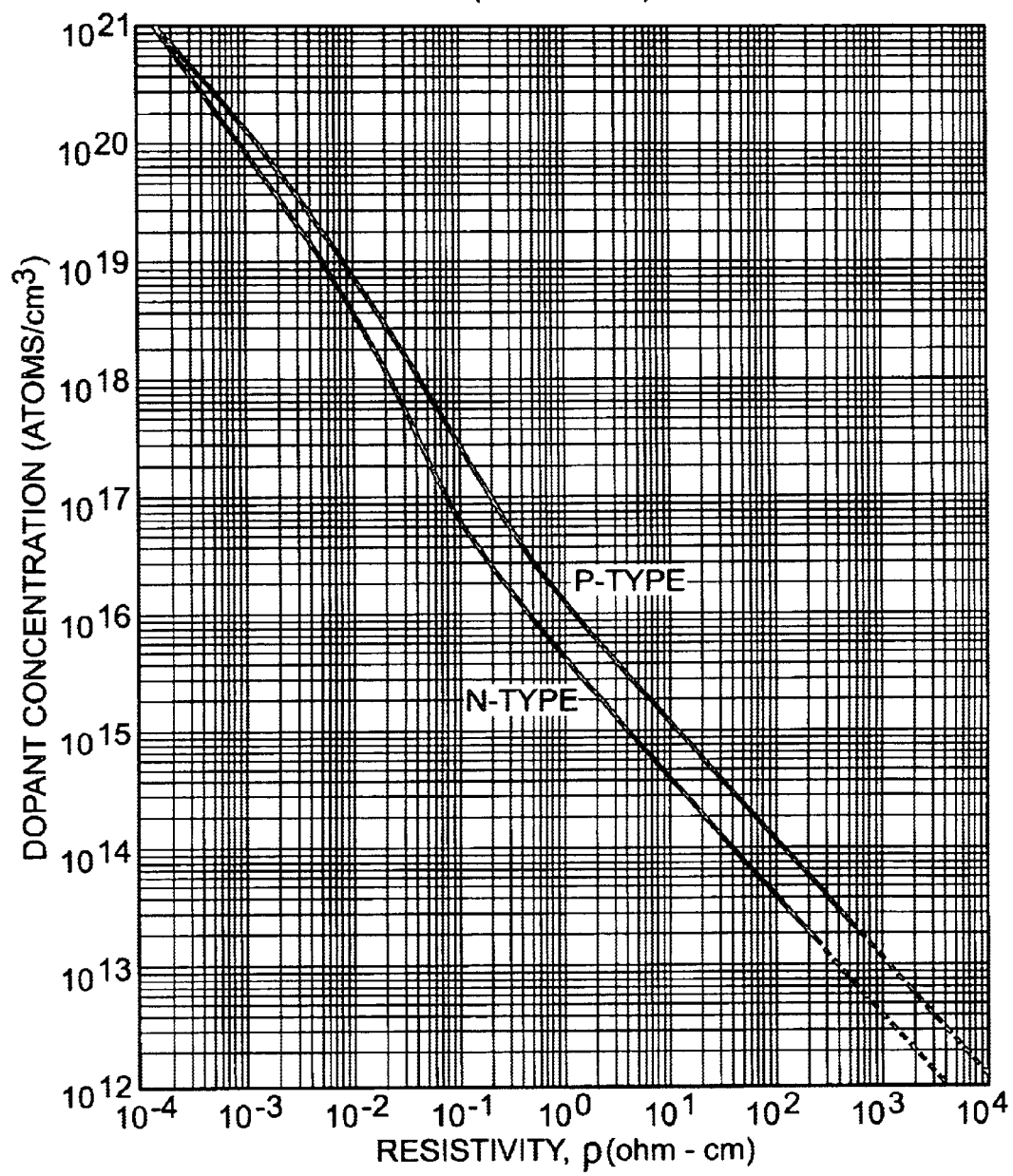
Fig. 9 RESISTIVITY vs. DOPANT CONCENTRATION (3)
(SINGLE DOPANT TYPE - UNIFORM CONCENTRATION)
(27°C=300K)

SEMICONDUCTOR DEVICES FABRICATED USING SPUTTERED SILICON TARGETS

CROSS REFERENCE TO RELATED APPLICATIONS

This application is a divisional of application Ser. No. 09/576,939, filed May 22, 2000, entitled "Sputtered Silicon Target for Fabrication of Polysilicon Thin Film Transistors," invented by Nakata et al., now U.S. Letters Pat. No. 6,432,804.

FIELD OF THE INVENTION

This invention relates to polysilicon thin film transistor (TFT) technology, and specifically to a process for manufacturing such devices.

BACKGROUND OF THE INVENTION

Thin film transistors (TFTs) are usually applied to liquid crystal displays (LCDs). This technology is also applicable to other devices, such as IC, X-ray imaging technology and sensor arrays, as well as specific products or product concepts, such as sheet computers, sheet phones, sheet recorders, etc.

Polysilicon TFTs are made by a variety of processes. The usual manner of constructing a polysilicon TFT LCDs is by a process known as top-gate. The process steps for this structure include: (1) depositing an amorphous silicon (a-Si) precursor; (2) dehydrogenation; (3) impurity doping to control Vth (threshold voltage) of the TFTs; (4) crystallization of amorphous silicon to polysilicon; (5) insulator deposition; (6) gate electrode formation; (7) impurity doping for the formation of low resistance source/drain regions; (8) activation of doped impurity; (9) hydrogenation; (10) interlayer formation; (11) source and drain contact hole etching; and (12) source and drain metal contact formation.

Typically, plasma-enhanced chemical vapor deposition (PE-CVD) or low-pressure CVD (LP-CVD) is used to deposit the amorphous silicon precursor. There are several advantages in using physical vapor deposition (PVD), i.e., sputtering, to form the silicon film. Such advantages are process reduction, i.e., no need for dehydrogenation, equipment cost reduction and improved process safety, because no toxic/pyrophoric gases are necessary. The additional advantage of PVD process is in the area of Vth control by impurity doping. This is a required process, regardless of the method chosen for the deposition of amorphous silicon.

U.S. Pat. No. 5,248,630 to Serikawa et al., for *Thin film silicon semiconductor device and process for producing thereof*, granted Sep. 28, 1993, describes a technique for forming a thin film silicon device.

U.S. Pat. No. 5,817,550 to Carey et al., for *Method for formation of thin film transistors on plastic substrates*, granted Oct. 6, 1998, describes the low-temperature formation of TFTs on a polymer substrate.

SUMMARY OF THE INVENTION

A method of forming a thin film device includes preparing a substrate; forming a silicon target having predetermined impurities therein; depositing a layer of amorphous silicon by physical vapor deposition from the target; and crystallizing the amorphous silicon layer to form a polysilicon layer. The method of the invention is particularly suited to the formation of thin film transistors and liquid crystal displays incorporating thin film transistors.

An object of the invention is to provide a target for a PVD process wherein the target is doped with specific impurities to deposit an active layer on a substrate.

A further object of the invention is to form a TFT wherein deposition of an amorphous silicon film is combined with impurity doping.

Another object of the invention is to form a TFT device where threshold voltage adjustment is achieved using fewer steps than required by the prior art.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 9 is a graph depicting silicon resistivity vs. doping concentration.

DETAILED DESCRIPTION OF THE PREFERRED EMBODIMENT

The method of the invention uses an appropriately doped silicon substrate target for the physical vapor deposition (PVD), or sputtering, process in order to eliminate the separate "impurity doping process" of the prior art. Deposition of an amorphous silicon film and impurity doping, to control threshold voltage, occur simultaneously, thus saving one step in the fabrication process.

Figure 1:
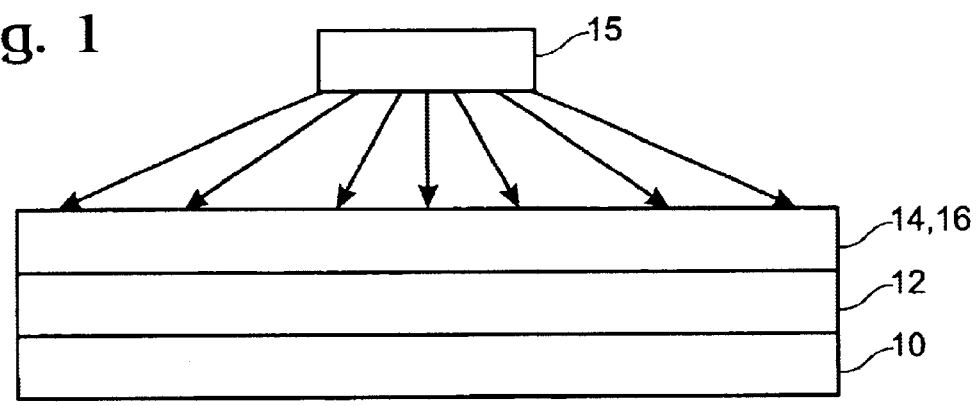
FIGS. 1–5 depict successive steps in the formation of a TFT device according to the invention.
Figure 4:
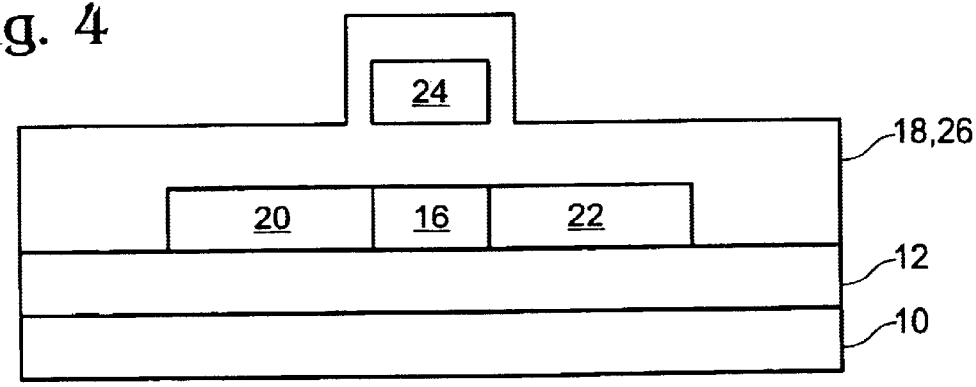
Figure 5:
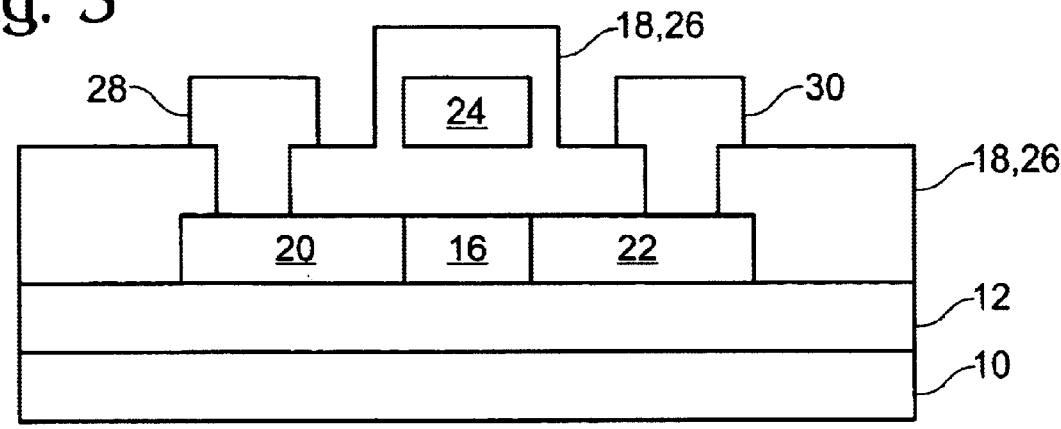
Figure 6:
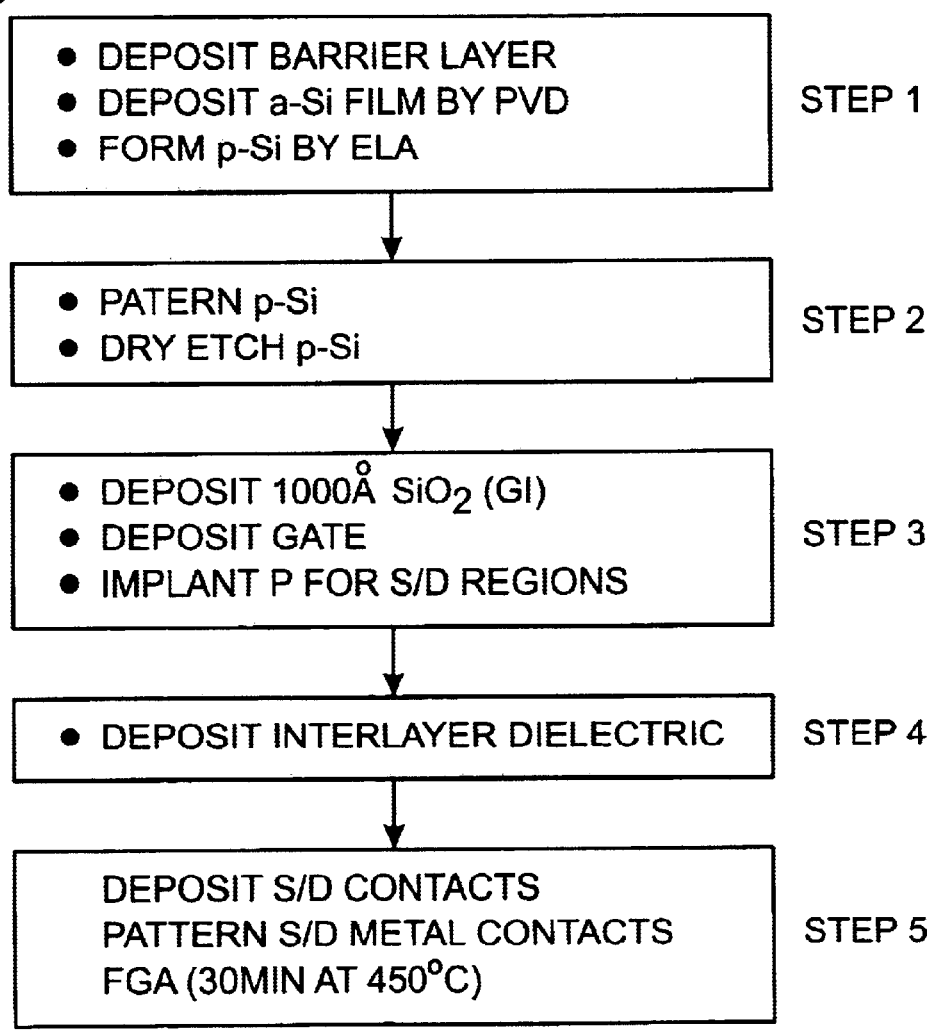
FIG. 6 is a flow chart of the invention.

FIGS. 1–5 illustrate the fabrication steps for a top-gate, polysilicon TFT device constructed according to the invention. FIG. 6 describes the steps of the process in flow-chart form. Referring now to FIG. 1 and step 1 of FIG. 6, a substrate 10 is formed and prepared by state-of-the art processes. Substrate 10 may be formed of a glass material, in the event that the TFT of the invention is to be part of a liquid crystal display (LCD), or may be a silicon substrate in the event that the TFT is to be part of an integrated circuit. A barrier layer 12 is formed on substrate 10, by appropriate deposition methods, such as CVD of $SiO_2$ or tetraethylorthosilicate (TEOS) oxide, to a thickness in a range of about 2000 Å to 3000 Å.

Next, a thin layer of amorphous silicon 14, having a preferred thickness of between about 300 Å and 500 Å, but an absolute thickness range of between about 100 Å to 1000 Å, is deposited by PVD. The target 15 used in the PVD chamber for this layer includes appropriate ions, also referred to herein as predetermined impurities, such as boron ions, phosphorous ions, or other ions, which provide for simultaneous deposition/doping, thus eliminating a step from the prior art process. In the preferred embodiment of practicing the invention, p-type silicon is doped with appropriate ions to form a substance having a resistivity of between about 0.5 Ω-cm to 60 Ω-cm for use as the PVD target, resulting in layer 14 having the same resistivity. In one embodiment of the invention, target 15 is a single polysilicon tile, having a minimum side dimension of at least 8.5". A layer 16 of polysilicon is formed by crystallization of the entire amorphous silicon layer 14, as by annealing. This may be done by excimer laser annealing (ELA), as an example, carried out in a nitrogen atmosphere at a laser energy level of 300 to 350 mJoules/cm², at atmospheric pressure and a temperature of approximately 400° C. The thickness of the amorphous silicon layer and the resulting polysilicon active layer is preferably about 50 nm, although the layer may have a thickness of between about 10 nm to 100 nm.

Figure 2:
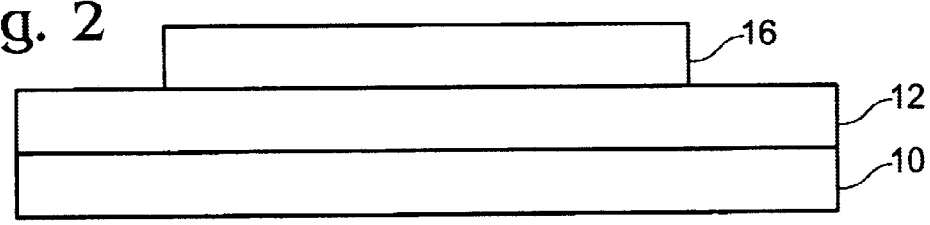

Polysilicon layer 16 is next patterned and dry etched, for example, using $CF_4$, $120/cm^3$, $+O_2$, $30/cm^3$, at an energy of 1.2 Kw and pressure of $40 \cdot 10^{-3}$ torr, as described in FIG. 6, step 2, resulting in the structure shown in FIG. 2.

Figure 3:
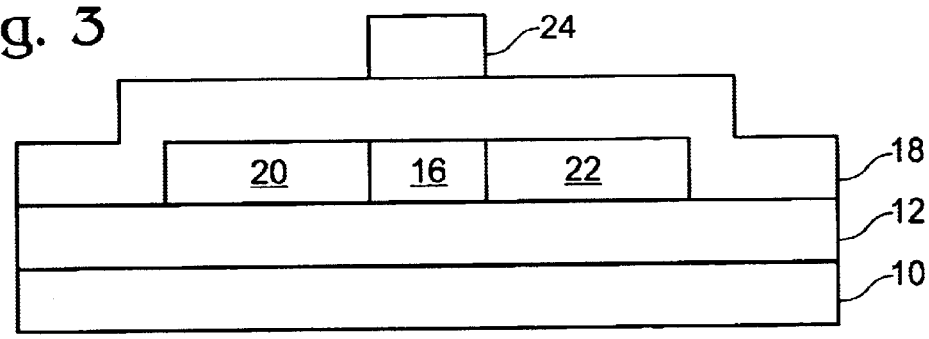

Referring now to FIG. 3 and FIG. 6, step 3, an insulating layer of $SiO_2$ 18 is deposited by plasma-enhanced CVD (PVD) to a thickness of about 1000 Å over the structure. A metal layer of, for instance, aluminum, is formed and patterned to form a gate electrode 24. A source region 20 and a drain region 22 are formed by implantation of appropriate impurities through the gate oxide, although the channel region is not doped at this time, as it is protected by the metal of gate 24, which is formed by sputtering and patterning metal, such as aluminum, onto the oxide surface. The structure is annealed by ELA, RTA, or furnace anneal, to activate the ions in the source and drain regions.

As shown in FIG. 4, and FIG., 6, step 4, an additional insulating layer 26 of $SiO_2$ is deposited over the structure, and combines with layer 18. As described in FIG. 6, step 5, the structure is wet or dry etched to form trenches for the source and drain electrodes, 28, 30, respectively, which are deposited and patterned, as shown in FIG. 5. Additional steps to complete fabrication of the device are well known to those of ordinary skill in the art.

The method described herein may also be used to make a Si target which can be used to deposit layers of $SiO_2$ and $SiN_x$ or similar compounds on a device by using a suitable gas mixture in a PVD chamber.

Figure 7:
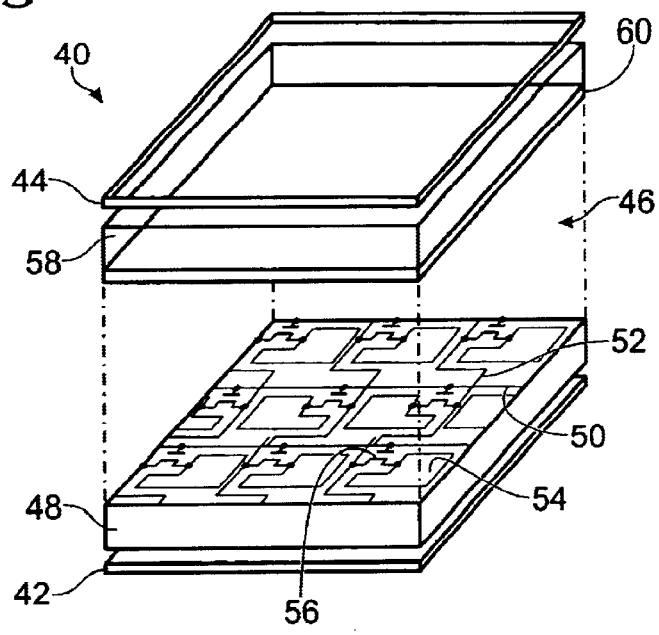
FIG. 7 depicts an LCD using the TFTs of the invention.

Referring now to FIG. 7, a liquid crystal display (LCD) apparatus 40 includes a lower polarizing plate 42 and an upper polarizing plate 44, which sandwich a liquid crystal (LC) layer 46 therebetween. LC layer 46 includes an insulating substrate 48 made of glass or other suitable material. Plural gate lines 50 run parallel with each other, and plural source lines 52 cross their respective gate lines 50. Lines 50 and 52 are formed on insulating substrate 48. Pixel electrodes 54 are disposed at positions adjacent to respective crossings of gate lines 50 and source lines 52, thus forming a matrix on insulating substrate 48. Pixel electrodes 54 are connected to gate lines 50 and source lines 52 through TFTs 56 of this example as switching elements.

LCD apparatus 40 further includes an insulating substrate 58 made of glass or other suitable material, which is disposed so as to oppose insulating substrate 48. A counter electrode 60 is formed on the inner surface of insulating substrate 58. Insulating substrates 48 and 58 are attached together, with liquid crystal contained therebetween, thus forming a liquid crystal layer 46 interposed pixel electrodes 54 and counter electrode 60. Polarizing plates 42 and 44 adhere to the outer surfaces of insulating substrates 48 and 58.

An important feature of the invention is the use of a silicon target which has already been doped with appropriate impurities to form the thin amorphous silicon film which is initially deposited by PVD and is then annealed by an ELA process to yield the thin polysilicon layer. The deposition of the silicon film is initially carried in a PVD vacuum chamber.

An advantage of the invention is the ability to adjust the level of resistivity of the target material that is used to deposit the thin Si-film, which will determine the threshold voltage, Vth, of the TFT device. If the resistivity of the Si-target is too low, which will result in a Vth which is too high, the resistivity of the target may be increased by reducing the level of impurity, which will be included in the deposited silicon film, which also increases the occurrence and frequency of micro-arcing on the surface of the target. This arcing process will yield particles and will cause instabilities in the plasma, which in turn will affect the uniformity and reproducibility of the deposited film's thickness and physical properties.

If the resistivity of the Si-target is too high, the impurity content in the silicon film may be reduced. As this film will be used to form the TFT channel region, the higher the level of impurities present in the film, the higher the Vth shift of the TFT device will be. A small threshold voltage shift is desirable to accommodate other aspects of the device fabrication sequence. As explained earlier, this small Vth shift is currently accomplished by a separate implantation (doping) process that is conducted after the film is deposited. In this case, the silicon film is doped with a p-type dopant, i.e., boron before further processing steps. PVD deposition process provides an opportunity to conduct this channel doping step simultaneously with the deposition of the film. This is possible because the target that is used for the silicon deposition, may be lightly doped p-type to accommodate the simultaneous doping of the film. However, due to the conflicting effects, the resistivity of the silicon target needs to be controlled within the proper process window. The lower end of this window is determined by FIGS. 8 and 9.

Figure 8:
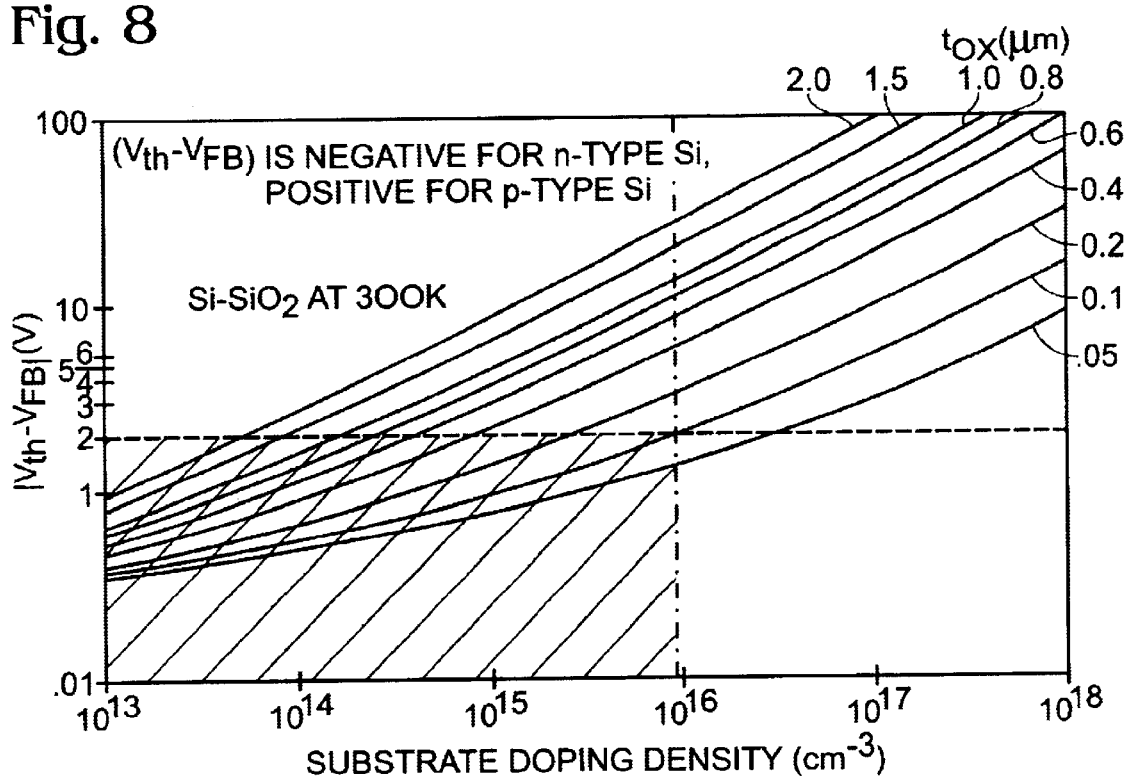
FIG. 8 is a graph of threshold voltage as a function of silicon substrate doping concentration.

Based on the data shown in FIG. 8 and the requirement that $|Vth-Vfb| \leq 2V$, the appropriate Si doping density is determined by selecting the gate oxide thickness in the range of 0.05–0.1 $\mu m$ (500–1000 Å). Under these conditions, the substrate doping density needs to be lower than $4 \times 10^{16}$ $at/cm^3$, as shown in the lower left corner of FIG. 8. Using the data of FIG. 9 and the above substrate doping density requirement, the resistivity of the target material needs to be higher than 0.5 Ω-cm in order to meet the Vth adjustment goal. It should be noted that in the above discussion, Vth denotes threshold voltage and Vfb denotes flat band voltage, typically around 1–2 V for good quality oxides on polysilicon.

If the resistivity of the target is too high, arcing problems will be encountered. Based on experimental results, a reasonable upper limit for the Si-target resistivity has been determined to be around 60 Ω-cm for magnetron sputtering process. Hence, the working resistivity, $\rho_s$, range of the silicon target material, compatible with magnetron sputtering is 0.5 Ω-cm<$\rho_s$<60 Ω-cm, and is preferably in a range of 0.5 Ω-cm<$\rho_s$<20 Ω-cm.

Different types of silicon material may be used for the target of a given resistivity in the above range. Single-crystal silicon targets and poly-crystalline silicon targets (polysilicon) have been used in experiments. The deposition characteristics are similar between the different materials, so long as both materials have the same resistivity and are of the same doping type, in this case p-type.

The material of the target is also important from the point of view of the number of tiles comprising the target. The number of tiles affects the overall area of tile edge as well as the number of tile gaps across the face of the target. It is better to minimize the number of tile gaps to the best possible extent, to reduce the risk of particle generation from the tile edges as same are exposed to the plasma. A Si-target of 650 mm×550 mm requires eight to twenty single-crystal Si (c-Si) tiles, but it requires only four polysilicon tiles.

Currently the maximum size of c-Si tiles is determined by the maximum size of Si-wafer ingots. This size is 12 inch diameter for the current state-of-the-art in Si-wafer technology. Based on the Si ingot size, the maximum square tile size that may be cut from a 12 inch circular ingot has a 8.5 inch side. In contrast, using polysilicon material, Si tiles of dimensions that far exceed this number have been fabricated. Specifically, rectangular Si-tiles, such as tile 15, measuring 12.6 inch×10.8 inch have been fabricated. It is possible to fabricate still larger tiles, up to the point where a single-tile target may be made of polysilicon material.

Thus, a method for forming a TFT, and a TFT constructed according to the invention, using fewer process steps than required by the prior art has been disclosed. It will be appreciated that further variations and modifications thereof may be made within the scope of the invention as defined in the appended claims.

We claim:

1. In a thin film transistor, an active silicon layer deposited by physical vapor deposition (PVD), wherein a silicon precursor is doped with impurities prior to use as a target in the PVD chamber, and wherein said precursor has a resistivity in the range of about 0.5 Ω-cm<$\rho_s$<60 Ω-cm; wherein said target includes plural rectangular tiles wherein all individual tiles are larger than 8.5 inches square.

2. The thin film transistor of claim 1 wherein said precursor has a resistivity in the range of about 0.5 Ω-cm<$\rho_s$<20 Ω-cm.

3. The thin film transistor of claim 1 wherein said silicon precursor is p-type silicon.

4. The thin film transistor of claim 1 wherein said silicon precursor is a material taken from the group of materials consisting of single crystal silicon and polysilicon.

5. The thin film transistor of claim 1 wherein said target is a single tile.

6. A liquid crystal display (LCD), including plural thin film transistors (TFTs) therein, wherein each TFT includes an active silicon layer deposited by physical vapor deposition (PVD), wherein a silicon precursor is doped with impurities prior to use as a target in the PVD chamber, and wherein said precursor has a resistivity in the range of about 0.5 Ω-cm<$\rho_s$<60 Ω-cm; wherein said target includes plural, rectangular tiles wherein all individual tiles are larger than 8.5 inches square.

7. The thin film transistor of claim 6, wherein said precursor has a resistivity in the range of about 0.5 Ω-cm<$\rho_s$<20 Ω-cm.

8. The thin film transistor of claim 6 wherein said silicon precursor is p-type silicon.

9. The thin film transistor of claim 6 wherein said silicon precursor is a material taken from the group of materials consisting of single crystal silicon and polysilicon.

10. The thin film transistor of claim 6 wherein said target is a single tile.

* * * * *